(12) United States Patent
Shi et al.

(10) Patent No.: US 7,176,382 B1
(45) Date of Patent: Feb. 13, 2007

(54) ELECTRICAL CIRCUIT BOARD AND METHOD FOR MAKING THE SAME

(75) Inventors: Zhong-You Shi, Ann Arbor, MI (US); Lakhi Nandal Goenka, Ann Arbor, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 398 days.

(21) Appl. No.: 10/189,674

(22) Filed: Jul. 8, 2002

Related U.S. Application Data

(62) Division of application No. 09/656,388, filed on Sep. 6, 2000, now Pat. No. 6,473,963.

(51) Int. Cl.
*H05K 1/00* (2006.01)
*H05K 7/20* (2006.01)
*H01B 7/42* (2006.01)

(52) U.S. Cl. .......... 174/254; 174/15.2; 361/718; 361/720; 185/104.33

(58) Field of Classification Search ............ 174/254, 174/252, 15.2, 258; 361/748–751, 719, 720, 361/700; 165/104.33
See application file for complete search history.

(56) References Cited

U.S. PATENT DOCUMENTS

| | | | |
|---|---|---|---|
| 3,801,388 A | 4/1974 | Akiyama et al. | |
| 4,404,059 A | 9/1983 | Livshits et al. | |
| 4,704,318 A * | 11/1987 | Saito et al. | 428/209 |
| 4,704,791 A | 11/1987 | Chellis et al. | |
| 4,859,520 A * | 8/1989 | Dubuisson et al. | 428/137 |
| 5,153,987 A | 10/1992 | Takahashi et al. | |
| 5,166,775 A * | 11/1992 | Bartilson | 361/690 |
| 5,227,588 A | 7/1993 | Schreiber et al. | |
| 5,546,655 A | 8/1996 | Feger et al. | |
| 5,738,797 A | 4/1998 | Belke, Jr. et al. | |
| 5,841,244 A * | 11/1998 | Hamilton et al. | 315/248 |
| 6,292,366 B1 * | 9/2001 | Platt | 362/700 |
| 6,330,153 B1 * | 12/2001 | Ketonen et al. | 361/690 |
| 6,473,963 B1 | 11/2002 | Goenka et al. | |
| 6,719,040 B2 * | 4/2004 | Sugito et al. | 165/104.21 |

FOREIGN PATENT DOCUMENTS

| | | |
|---|---|---|
| JP | 6252559 | 9/1994 |
| SU | 293311 | 3/1971 |
| SU | 218975 | 2/1974 |

* cited by examiner

*Primary Examiner*—Dean A. Reichard
*Assistant Examiner*—Jeremy C. Norris
(74) *Attorney, Agent, or Firm*—Brinks Hofer Gilson & Lione

(57) ABSTRACT

A multi-layer circuit board with heat pipes and a method for forming a multi-layer circuit board with heat pipes. The method includes forming channels in a first and second pre-circuit assembly and attaching the first pre-circuit assembly to the second pre-circuit assembly such that the channels cooperatively form a heat pipe.

17 Claims, 4 Drawing Sheets

ELECTRICAL CIRCUIT BOARD AND METHOD FOR MAKING THE SAME

This application is a divisional of nonprovisional application Ser. No. 09/656,388, filed on Sep. 6, 2000 now U.S. Pat. No. 6,473,963.

(1) FIELD OF INVENTION

The present invention relates to a method for making an electrical circuit board and more particularly, to a method for making a multi-layer electrical circuit board having pipes, tunnels and/or caverns which are formed within the circuit board and/or through various portions of the circuit board, and which allow heat emanating from components which are contained within the circuit board to be efficiently dissipated.

(2) BACKGROUND OF THE INVENTION

Multi-layer circuit boards contain and/or include electrical components which selectively and operatively populate opposed first and second surfaces (i.e., top and bottom surfaces) of each board (or other respective interior portions of each board), thereby desirably allowing each of the electrical circuit boards to contain and/or include a relatively large amount of electrical components which efficiently and densely populate the respective boards.

Due to the relatively dense component population, substantial amounts of heat are produced and/or generated within relatively small areas of the circuit boards. This generated heat undesirably prevents the components from properly functioning and may even irrevocably damage or destroy these components. Therefore it is desirable to form, create and/or manufacture circuit boards that are adapted to disperse and/or dissipate heat away from such heat producing components.

Pipes, tunnels and/or caverns, commonly referred to as "heat pipes", may be used to disperse, dissipate and/or translate heat within these multi-layer circuit boards. Conventional heat pipes typically comprise an elongated material which forms a pair of open ends and which further forms a tunnel extending down the length of the elongated material and communicating with each of the open ends. By way of example and without limitation, a conventional heat pipe is typically operatively placed within an electronic assembly such that a first portion of the pipe is disposed near a warm or heat emitting component of the equipment and a second portion of the pipe is disposed near a cooler or heat absorbing area of the assembly, thereby allowing the pipe to transfer heat away from the heat emitting component toward the cooler or heat absorbing area.

One drawback associated with these conventional heat pipes is that they are typically made and/or manufactured from "additional" materials that are not needed for the functioning of the electronics equipment within which the heat pipes reside. Employing heat pipes which use additional materials is especially undesirable in a multi-layer circuit board which is designed to support and/or contain several electrical components in a relatively small amount of space. Particularly, such additional materials add both unwanted size and weight to multi-layer circuit boards.

Consequently, there is a need for circuit boards created by a method which allows many small electrical components to densely populate respective layers within the circuit boards, while still allowing heat to be dissipated and/or dispersed away from heat-emitting components. Specifically, there is a need for a method of creating heat pipes within multi-layer circuit boards which are integrally formed within the circuit boards such that very little "excess" or additional material is needed to create the heat pipes.

SUMMARY OF THE INVENTION

It is a first object of the present invention to provide a method for forming heat pipes within multi-layer circuit boards which overcomes the various previously delineated drawbacks of conventional heat pipes.

It is a second object of the present invention to provide heat pipes that are integrally manufactured from the original materials that are used when making a multi-layer circuit board.

According to a first aspect of the present invention a circuit board is disclosed. The circuit board includes a first and second pre-circuit assembly each including a first and second core metal portion, the first and second core metal portions respectively including a first and second channel; wherein the first pre-circuit assembly is attached to the second pre-circuit assembly such that the first and second channels cooperatively form a heat pipe.

According to a second aspect of the present invention, a method for producing a multi-layer circuit board having a heat pipe is disclosed. The method includes the steps of: providing a first and second pre-circuit assembly respectively having a first and second core metal portion; applying protective layers to the pre-circuit assemblies, effective to leave a first exposed portion on the first core metal portion and a second exposed portion on the second core metal portion; removing the first and second exposed portions to respectively form a first and second channel within the first and second core metal portions; and attaching the first pre-circuit assembly to the second pre-circuit assembly effective to cause the first and second channel to cooperatively form a pipe within the circuit board.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Referring now to FIGS. 1(a)–(g), there is shown a method and/or process for selectively forming a multi-layer electrical circuit board 10 in accordance with a preferred embodiment of the present invention. It shall be understood that while FIGS. 1(a)–(g) illustrate sectional side views of only portions of pre-circuit assemblies 12, 14 and/or of circuit board 10, the concept and/or steps of the method or process of the present invention may be used on an entire circuit board. For a fuller view of a circuit board 100 having a heat pipe formed according to the present invention, reference will be made to FIGS. 2(a) and 2(b).

Figure 1A:
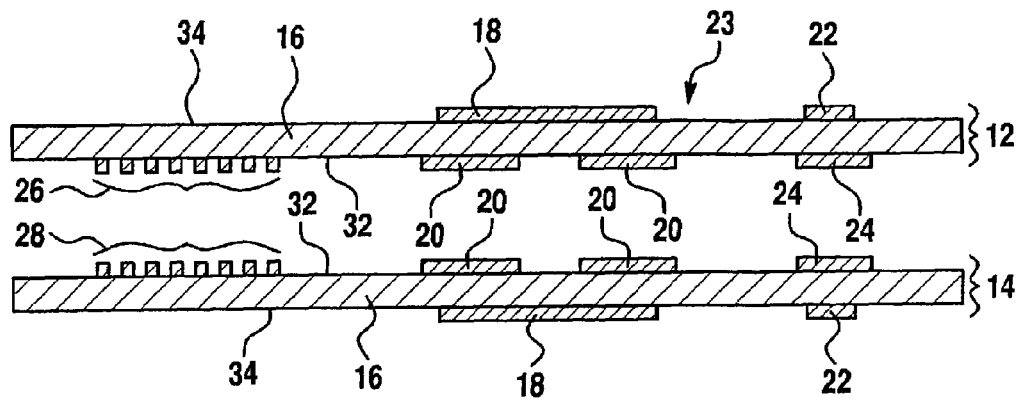
FIG. 1(a) illustrates a partial sectional view of a pair of pre-circuit assemblies which have been formed and/or manufactured in accordance with the teachings of the preferred embodiment of the present invention.

Referring now to FIG. 1(a), there is shown and/or provided a pair of pre-circuit assemblies 12, 14 which are formed in accordance with the teachings of the present invention. Each pre-circuit assembly 12, 14 includes a core metal portion 16 which is preferably manufactured and/or formed from a conventional aluminum material. Each pre-circuit assembly 12, 14 also includes an outer pipe member 18 and two inner pipe members 20 which are preferably formed from a conventional copper material. Furthermore, each pre-circuit assembly 12, 14 includes an outer support member 22, an inner support member 24, and "flip chip" pads 26, 28 which are also preferably formed from a conventional copper material. As illustrated in FIG. 1(a), members 18, 20, 22, 24 and pads 26, 28 are all attached, coupled and/or connected in a conventional manner (e.g., adhesively secured) to core metal portions 16.

Pre-circuit assemblies 12, 14 may be formed, provided and/or manufactured in a variety of known and conventional manners. In one preferred embodiment, pre-circuit assemblies 12, 14 are formed and/or manufactured by conventionally attaching, bonding and/or adhering copper plates (not shown) to inner and outer surfaces 32, 34 of core metal portions 16 followed by selective removal of portions of the copper plates in a conventional manner (e.g., by etching) to form members 18, 20, 22, 24 and pads 26, 28 as shown in FIG. 1(a).

Figure 1B:
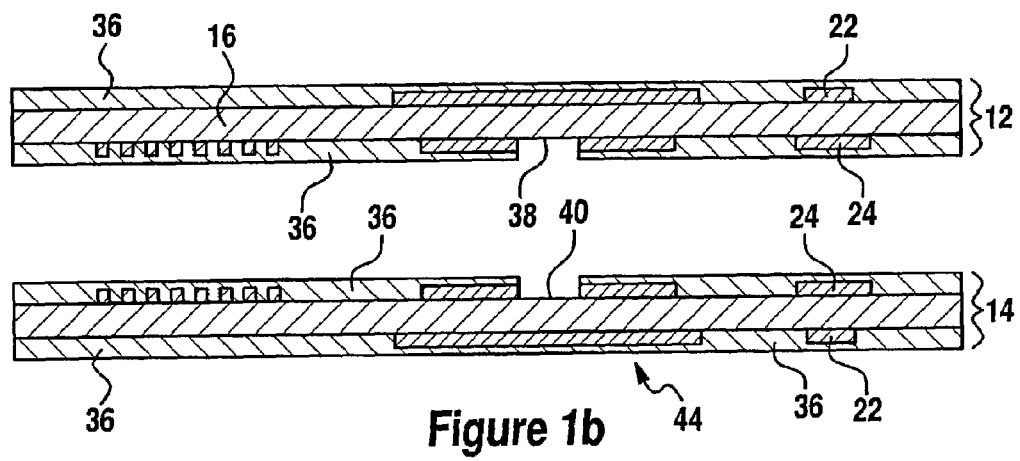
FIG. 1(b) illustrates a partial sectional view of the pre-circuit assemblies of FIG. 1(a) having protective layers formed in accordance with the teachings of the preferred embodiment of the present invention.

Referring now to FIG. 1(b), there is shown pre-circuit assemblies 12, 14 which have protective layers 36 selectively applied in a conventional manner to cover portions of assemblies 12, 14. In one non-limiting embodiment, protective layers 36 are comprised of a commercially available dielectric "etch-resistant" material which is applied to pre-circuit assemblies 12, 14 in a conventional manner using a conventional press. Preferably, protective layers 36 are applied to cover significantly all of the surface area of pre-circuit assemblies 12, 14 with the exception of uncovered and/or exposed portions 38, 40.

Figure 1C:
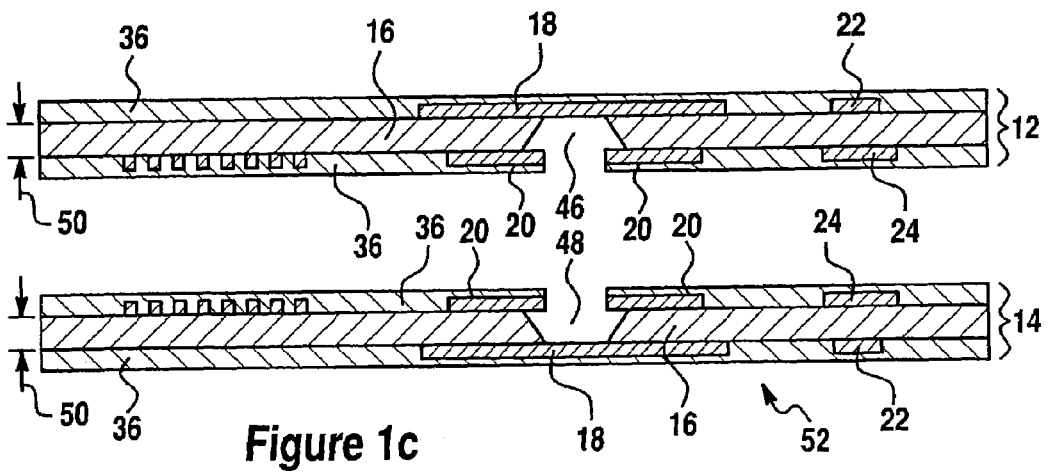
FIG. 1(c) illustrates a partial sectional view of the pre-circuit assemblies of FIG. 1(b) having channels formed in accordance with the teachings of the preferred embodiment of the present invention.
Figure 1D:
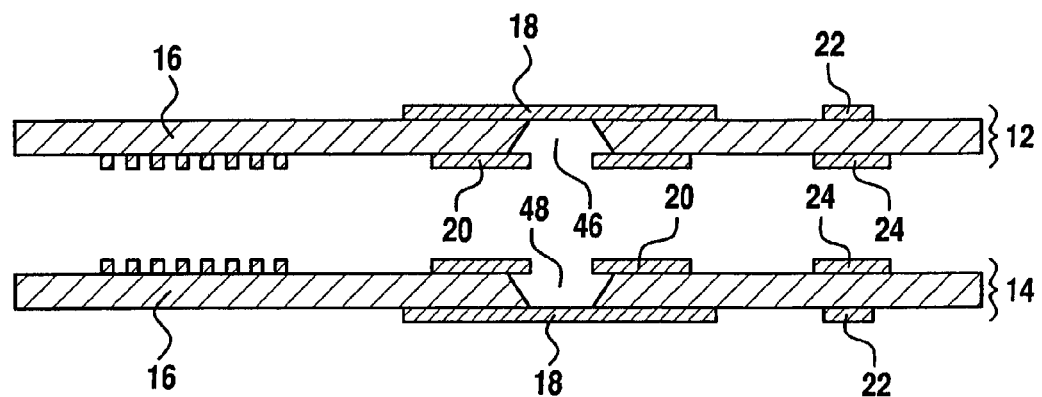
FIG. 1(d) illustrates a partial sectional view of the pre-circuit assemblies of FIG. 1(c) after removal of the protective layers.

Referring now to FIG. 1(c), there is shown pre-circuit assemblies 12, 14 which include apertures and/or channels 46, 48. Apertures and/or channels 46, 48 are formed within member 16 in a conventional manner (e.g., by etching). In one non-limiting embodiment, channels 46, 48 are etched by immersing pre-circuit assemblies 12, 14 in a conventional and commercially available etchant material, effective to remove and/or "etch away" a portion of each core metal portion 16 such that the inner pipe members 20 "border" or partially form channels 46, 48. In the non-limiting embodiment of the invention shown in FIG. 1(c), exposed portions 38, 40 are selectively etched to form channels 46, 48 which extend to and/or abut outer pipe members 18. However, it will be appreciated that exposed portions 38, 40 may be removed to form channels 46, 48 in a variety of other sizes and geometric configurations. Further, exposed portions 38, 40 need not be removed such that they extend to and/or abut outer pipe members 18, rather, exposed portions 38, 40 may be formed or created by removing only a portion of the thickness 50 of core metal portions 16. In this situation, core metal portions 16 will entirely define channels 46, 48 and, therefore, render outer pipe members 18 unneeded and/or extraneous. Once channels 46, 48 have been formed, protective layers 36 may be removed in a known and conventional manner to yield the assemblies 12, 14 as shown in FIG. 1(d).

Figure 1E:
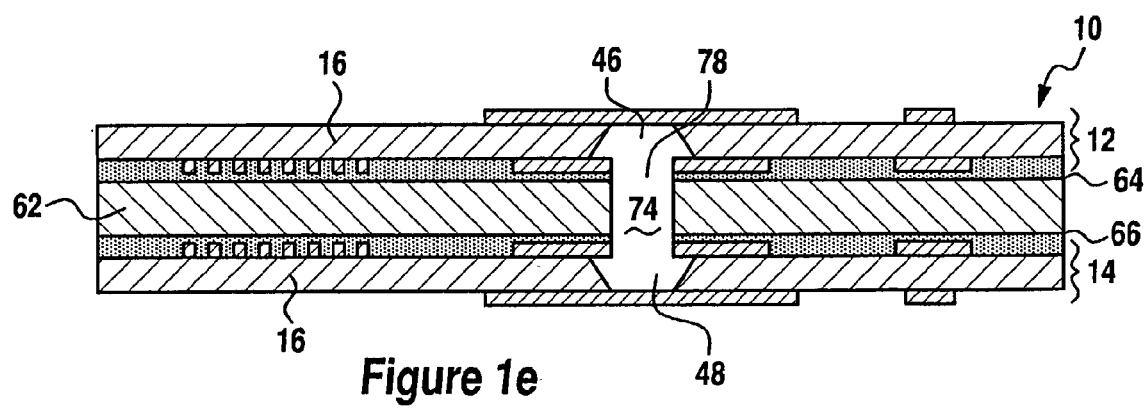
FIG. 1(e) illustrates a partial sectional view of the circuit board formed in accordance with the teachings of the preferred embodiment of the present invention.

Referring now to FIG. 1(e), there is shown circuit board 10 made in accordance with the teachings of the present invention. Circuit board 10 is made, formed and/or manufactured by attaching and/or coupling pre-circuit assemblies 12, 14 to a core member 62. Core member 62 is preferably manufactured from an aluminum, copper or other conductive material. In the non-limiting embodiment shown in FIG. 1(e), pre-circuit assemblies 12, 14 are attached to core member 62 through the use of conventional adhesive layers 64, 66. In one particular non-limiting embodiment pre-circuit assemblies 12, 14 are adhesively secured to core member 62 by conventional and commercially available adhesive layers 64, 66 through the use of a one-step laminating process.

In the non-limiting embodiment shown in FIG. 1(e), core member 62 includes an opening and/or aperture 74 which substantially corresponds to and communicates with channels 46, 48. That is, aperture 74 of core member 62 substantially aligns with channels 46, 48 when pre-circuit assemblies 12, 14 are attached, coupled and/or connected to core member 62, and cooperates with channels 46, 48 to create and/or form a pipe, cavern and/or tunnel 78 which extends within circuit board 10. Opening and/or aperture 74 is formed and/or created within core member 62 in a conventional manner (e.g., by routing, stamping, drilling, punching and/or etching). In the preferred embodiment of the present invention, channels 46, 48 are substantially identical in shape and size as they extend within, into and/or through portions of circuit board 10, and aperture 74 substantially and continuously interconnects channel 46 to channel 48 such that pipe 78 is a continuous opening that extends within, into and/or through portions of circuit board 10.

In one non-limiting embodiment of the present invention, a wicking material (not shown) is selectively applied to the surfaces which cooperatively form and/or define pipe 78. That is, a wicking material is applied to those portions or surfaces of pre-circuit assemblies 12, 14, adhesive materials 64, 66, and core member 62 which cooperatively form and/or define pipe 78. Preferably, the wicking material is applied to the aforementioned surfaces prior to the step of connecting and/or laminating pre-circuit assemblies 12, 14 to core member 62.

Figure 1F:
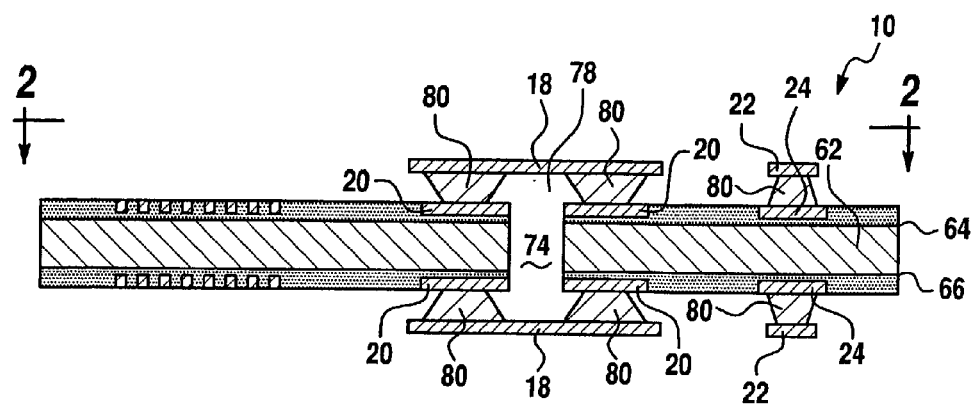
FIG. 1(f) illustrates a partial sectional view of the circuit board shown in FIG. 1(e) which is further formed in accordance with the teachings of the preferred embodiment of the present invention.
Figure 1G:
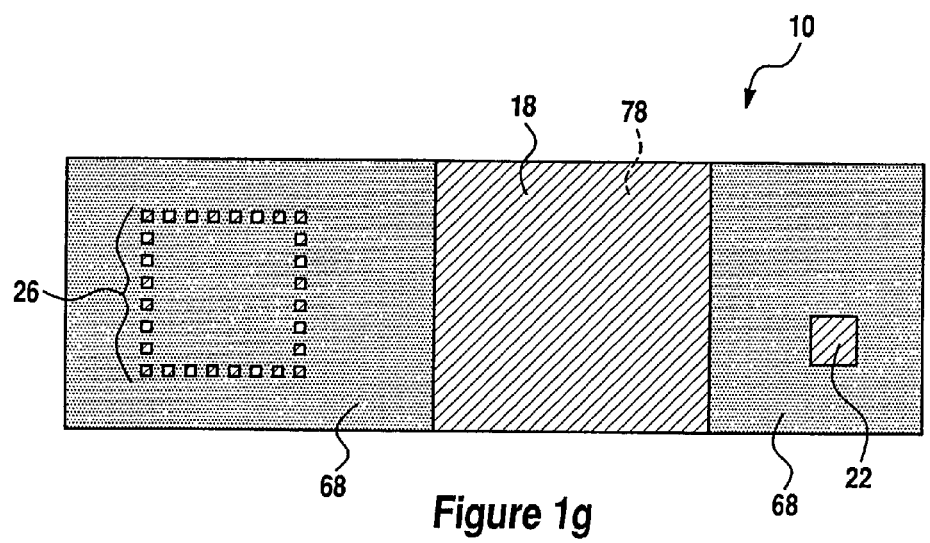
FIG. 1(g) illustrates a top view of the portion of the circuit board illustrated in FIG. 1(f).

Referring now to FIG. 1(f), circuit board 10 is shown after it has been further formed and/or processed according to the teachings of the preferred embodiment of the present invention. In this non-limiting embodiment, portions of core metal portions 16 have been removed in a conventional manner (e.g., by etching, drilling, routing or stamping), thereby forming connection portions 80. Connection portions 80 connect and/or attach outer pipe members 18 to inner pipe members 20 and outer support members 22 to inner support members 24. FIG. 1(g) illustrates a top view of the portion of circuit board 10 in FIG. 1(f). As can be seen in the non-limiting embodiment of FIG. 1(g), outer pipe member 18 and pipe 78 extend across the portion of circuit board 10 shown in FIG. 1(g) and outer support member 22 is substantially square shaped and resides near member 18.

Figure 2A:
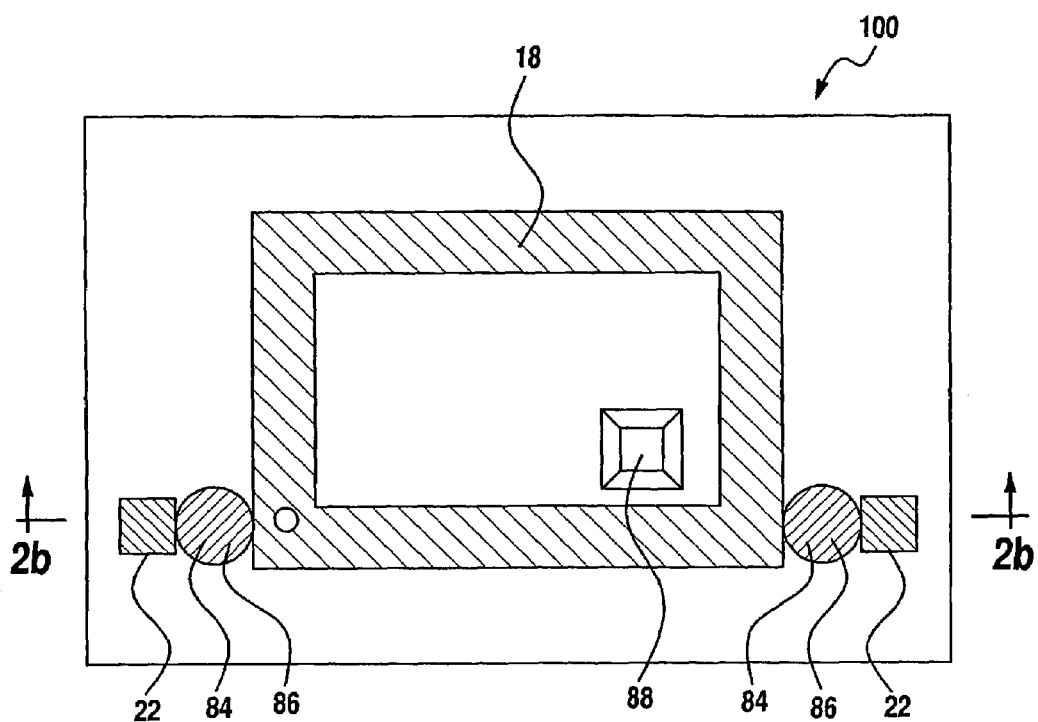
FIG. 2(a) illustrates a top view of a circuit board or a portion of a circuit board which includes a heat pipe which is formed in accordance with the teachings of the present invention.

Referring now to FIG. 2(a) there is shown a top view of a circuit board 100 or a portion of a circuit board 100 which includes an entire pipe 78 according to the teachings of the preferred embodiment of the invention. It should be appreciated that circuit board 10 may comprise a portion of circuit board 100. Further, referring to FIG. 2(b), there is shown a sectional side view of circuit board 100 taken along line 2b—2b of FIG. 2(a). In this non-limiting embodiment, pipe or tunnel 78 extends through circuit board 100 and forms a generally rectangular shape.

Figure 2B:
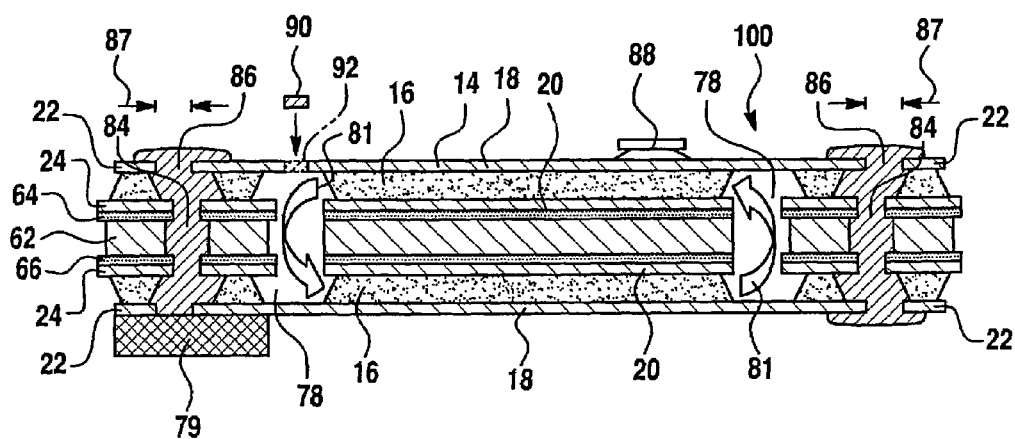
FIG. 2(b) illustrates a sectional side view of the circuit board in FIG. 2(a).

Also illustrated in FIGS. 2(a) and 2(b) are through-holes, apertures and/or vias 84 which have been formed within circuit board 100 and which are disposed adjacent to or in relative close proximity to heat pipe 78. In the non-limiting embodiment shown in FIGS. 2(a) and 2(b), vias 84 have been formed by selectively removing portions of core layer 62 and adhesive layers 64, 66 from areas 87 such that vias 84 extend through circuit board 100 and between inner pipe members 20 and inner support members 24 and between outer pipe members 18 and outer support members 22. In this non-limiting embodiment of the present invention, vias 84 have been formed in a conventional manner (e.g., by punching, etching and/or drilling) and selectively receive a material 86 (e.g., solder) with high thermal conductivity. When vias 84 receive and retain such a material 86, the material 86 tends to attract, absorb and/or dissipate heat from pipe 78 very quickly and efficiently, thereby allowing heat pipe 78 to remove greater amounts of heat from other portions of circuit board 100. For even greater and faster heat dissipation, a conventional heat sink 79 may be attached and/or coupled to material 86 in a known and conventional manner. In the embodiment shown in FIGS. 2(a) and 2(b), heat is emitted by a hot power device 88 into heat pipe 78. From there, the heat is removed or "drawn" from heat pipe 78 by material 86 and is thereby "vented" out of circuit board 100 to heat sink 79.

In a further embodiment of the circuit board, a conventional cooling material or fluid (i.e., a fluid with high thermal conductivity) may be placed in the pipe 78 such that the fluid is free to flow and or move through the pipe 78 as indicated by arrows 81. Such fluids may be liquid, gas and/or vapor as long as they can quickly absorb heat from warm areas (e.g., areas near hot power device 88) and quickly purge heat to cooler areas (e.g., areas containing material 86). In one embodiment of the invention, a sealing member 90 is removed from member 18 to form an aperture or hole 92, which communicates with pipe 78, and the cooling fluid is selectively inserted or placed into pipe 78. Member 90 is then replaced and/or reattached (i.e., welded) in its original position, thereby sealing the cooling fluid within pipe 78.

It should be understood that this invention is not to be limited to the exact construction or embodiment described above but that various changes may be made without departing from the spirit or scope of the invention.

What is claimed is:

1. A circuit board comprising:
   a first electric pre-circuit assembly including a first core metal portion having a first channel which is integrally formed within said first core metal portion; and
   a second electric pre-circuit assembly having a second core metal portion and a second channel which is integrally formed within said second core metal portion;
   wherein said first electric pre-circuit assembly is attached to said second electric pre-circuit assembly such that said first and second channels cooperatively form a heat pipe; and wherein said first electric pre-circuit assembly includes a first and second inner pipe member which at least partially and cooperatively form said first channel and wherein said second electric pre-circuit assembly includes a third and fourth inner pipe member which at least partially and cooperatively form said second channel.

2. The circuit board according to claim 1, further comprising a wicking material which at least partially coats a surface which at least partially forms said heat pipe.

3. A circuit board as in claim 1, wherein said first and second electric pre-circuit assemblies respectively include first and second outer pipe members and wherein said first and second channels respectively extend to said first and second outer pipe members.

4. A circuit board as in claim 1 wherein said circuit board includes a hole which communicates with said heat pipe and which allows said heat pipe to be selectively filled with a thermally conductive material.

5. A circuit board as in claim 1 wherein said first and second core metal portions comprise aluminum.

6. A circuit board as in claim 1 wherein a heat sink is attached to said circuit board in relative close proximity to said heat pipe.

7. A circuit board as in claim 1 wherein said heat pipe contains a thermally conductive material.

8. A circuit board as in claim 7 wherein said thermally conductive material comprises a gas.

9. A circuit board as in claim 7 wherein said thermally conductive material comprises a liquid.

10. A circuit board as in claim 1 wherein said first electric pre-circuit assembly is attached to a first surface of a core member and said second electric pre-circuit assembly is attached to a second surface of said core member and wherein said core member includes an aperture which cooperatively forms said heat pipe together with said first and second channels.

11. A circuit board comprising:
   an electrically conductive first core member having a top surface and a bottom surface, said core member having an aperture interconnecting said top surface to said bottom surface;
   a first pre-circuit assembly comprising a second core member, at least one first inner support member, and at least one first outer support member, said second core member having a first channel portion which is substantially aligned with said aperture, wherein said first pre-circuit assembly is adhesively coupled to said top surface of said first core member;
   a second pre-circuit assembly comprising a third core member, at least one second inner support member, and at least one second outer support member, said third core member having a second channel portion which is substantially aligned with said aperture, wherein said second pre-circuit assembly is adhesively coupled to said bottom surface of said first core member;

wherein said first channel, said second channel, and said aperture cooperatively form a heat pipe through said circuit board wherein said first pre-circuit assembly further comprises a pair of first inner pipe members and a first outer pipe member, said first inner pipe members being disposed abutting said first channel and said first outer pipe member substantially covering said first channel on the side opposite to said first inner pipe members;

said second pre-circuit assembly further comprises a pair of second inner pipe members and a second outer pipe member, said second inner pipe members being disposed abutting said second channel and said second outer pipe member substantially covering said second channel on the side opposite to said second inner pipe members; and wherein said first channel passes substantially through said first pre-circuit assembly and wherein said second channel passes substantially through said second pre-circuit assembly.

12. A circuit board according to claim 11 further comprising an amount of cooling material which is disposed within said heat pipe.

13. A circuit board comprising:

a electrically conductive first core member having a first aperture and at least one second aperture, said at least one second aperture being in relatively close proximity to said first aperture;

a first pre-circuit assembly including a second core member having a first channel and at least one third aperture formed therein, said first pre-circuit assembly being adhesively coupled to said first core member, wherein said first channel is substantially aligned with said first aperture and said at least one third aperture is substantially aligned with said at least one second aperture, said first channel being effective to enclose a first end of said first aperture;

a second pre-circuit assembly including a third core member having a second channel and at least one fourth aperture formed therein, said second pre-circuit assembly being adhesively coupled to said first core member, wherein said second channel is substantially aligned with said first aperture and said at least one fourth aperture is substantially aligned with said at least one second aperture, said second channel being effective to enclose a second end of said first aperture, thereby fully enclosing said first aperture;

wherein said enclosed first aperture cooperates with said first channel and said second channel to form a heat pipe and wherein said at least one second aperture, said at least one third aperture and said at least one fourth aperture cooperate to form at least one via through said circuit board.

14. A circuit board according to claim 13 further comprising an amount of solder material which is disposed within said at least one via.

15. A circuit board according to claim 14 further comprising at least one heat sink assembly, wherein said at least one heat sink assembly is coupled to said first pre-circuit assembly and to said solder material within said at least one via.

16. A circuit board according to claim 13 wherein said first pre-circuit assembly includes a fifth aperture which communicates with said heat pipe, said first pre-circuit assembly further comprising a sealing member which is sealingly disposed within said fifth aperture.

17. A circuit board according to claim 16 further comprising an amount of cooling material which is disposed within said heat pipe.

* * * * *